(12) United States Patent
Shiozaki

(10) Patent No.: US 8,748,924 B2
(45) Date of Patent: Jun. 10, 2014

(54) DISPLAY APPARATUS AND METHOD FOR MANUFACTURING THE SAME

(75) Inventor: Atsushi Shiozaki, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/445,683

(22) Filed: Apr. 12, 2012

(65) Prior Publication Data

US 2012/0261698 A1    Oct. 18, 2012

(30) Foreign Application Priority Data

Apr. 18, 2011  (JP) ................. 2011-092156

(51) Int. Cl.
*H01L 51/52* (2006.01)
*H01L 51/56* (2006.01)

(52) U.S. Cl.
USPC .......... 257/98; 438/27; 257/40; 257/E51.018; 257/E51.001

(58) Field of Classification Search
USPC .......... 257/40, 98, E51.018, E51.001; 438/27
See application file for complete search history.

(56) References Cited

U.S. PATENT DOCUMENTS 7,355,339 B2 *  4/2008  Okinaka et al. ............... 313/504

FOREIGN PATENT DOCUMENTS

| JP | 2004-317559 A | 11/2004 |
|---|---|---|
| JP | 2006-337846 A | 12/2006 |

* cited by examiner

*Primary Examiner* — Matthew W Such
*Assistant Examiner* — Monica D Harrison
(74) *Attorney, Agent, or Firm* — Canon U.S.A., Inc. IP Division

(57) ABSTRACT

A method includes forming a light absorbing layer, and forming a foundation layer before forming a lens portion such that the foundation layer covers a region where the lens portion is to be formed, wherein the foundation layer is in contact with the light absorbing layer and the lens portion once the lens portion is formed.

7 Claims, 8 Drawing Sheets

DISPLAY APPARATUS AND METHOD FOR MANUFACTURING THE SAME

BACKGROUND OF THE INVENTION

1. Field of the Invention

The present invention relates to a display apparatus having organic electroluminescent elements and a method for manufacturing the same.

2. Description of the Related Art

In recent years, display apparatuses that have a plurality of organic electroluminescent elements that each have an organic compound layer between a pair of electrodes have been actively developed. It is known to provide lenses in such display apparatuses in order to efficiently extract light emitted from the organic electroluminescent elements. It is also known to provide a light absorbing layer in order to reduce reflection of external light.

Japanese Patent Laid-Open No. 2004-317559 discloses an organic electroluminescent apparatus that has a lens array on organic electroluminescent elements. The lens array has lenses and a bank serving as a light absorbing layer. Japanese Patent Laid-Open No. 2004-317559 discloses forming a bank serving as a light absorbing layer on a substrate, and forming lenses in contact with the light absorbing layer and in desired regions on the substrate.

However, the lenses of Japanese Patent Laid-Open No. 2004-317559 are in contact with a plurality of regions formed of different materials, that is, the light absorbing layer and the substrate, and thus the following problems arise. That is, since the adhesion to the lenses and the thermal stress differ depending on the material with which the lenses are in contact, mechanical stress concentration tends to occur, and detachment or cracking occurs when forming the lenses.

SUMMARY OF THE INVENTION

The present invention suppresses detachment and cracking of lenses.

In an aspect of the present invention, a method for manufacturing a display apparatus includes, in order, forming a plurality of organic electroluminescent elements on a substrate, forming a light absorbing layer outside the light-emitting regions of the plurality of organic electroluminescent elements, and forming a lens portion over the light-emitting regions of the plurality of organic electroluminescent elements. The method further includes, between forming a light absorbing layer and forming a lens portion, forming a foundation layer such that the foundation layer covers a region where the lens portion is to be formed, and wherein the foundation layer is in contact with the light absorbing layer and the lens portion once the lens portion is formed.

In another aspect of the present invention, a display apparatus includes a substrate, a plurality of organic electroluminescent elements on the substrate, a light absorbing layer outside the light-emitting regions of the plurality of organic electroluminescent elements, and a lens portion over the light-emitting regions of the plurality of organic electroluminescent elements. The light absorbing layer is closer to the organic electroluminescent elements than the lens portion. The display apparatus further includes, between the light absorbing layer and the lens portion, a foundation layer that covers a region upon which the lens portion is formed, and wherein the foundation layer is in contact with the light absorbing layer and the lens portion.

The present invention can reduce mechanical stress concentration and can reduce detachment and cracking of lenses.

Further features of the present invention will become apparent from the following description of exemplary embodiments with reference to the attached drawings.

DESCRIPTION OF THE EMBODIMENTS

Embodiments of display apparatus according to the present invention will now be described with reference to the drawings. To parts not particularly illustrated or described in this specification, well-known or publicly known techniques in the technical field will be applied. The present invention is not limited to the embodiments described below.

First Embodiment

Figure 1A:
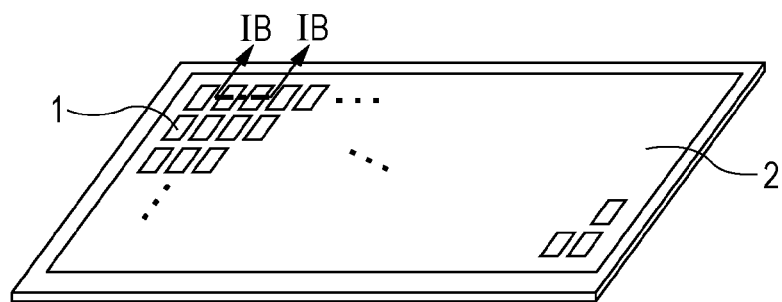
FIGS. 1A to 1C are schematic views of a display apparatus according to first and second embodiments.

FIG. 1A is a perspective schematic view showing a display apparatus according to a first embodiment of the present invention. The display apparatus of this embodiment has a plurality of pixels 1 that each have an organic electroluminescent element. The plurality of pixels 1 are arranged in a matrix and form a display region 2. The term "pixel" means a region corresponding to the light-emitting region of a light-emitting element. In the display apparatus of this embodiment, the light-emitting elements are organic electroluminescent elements, and an organic electroluminescent element of one color is disposed in each of the pixels 1. The emission colors of the organic electroluminescent elements can be red, green, and blue, or in addition to these, yellow, cyan, or white, and are not particularly limited as long as they are at least two colors.

Figure 1B:
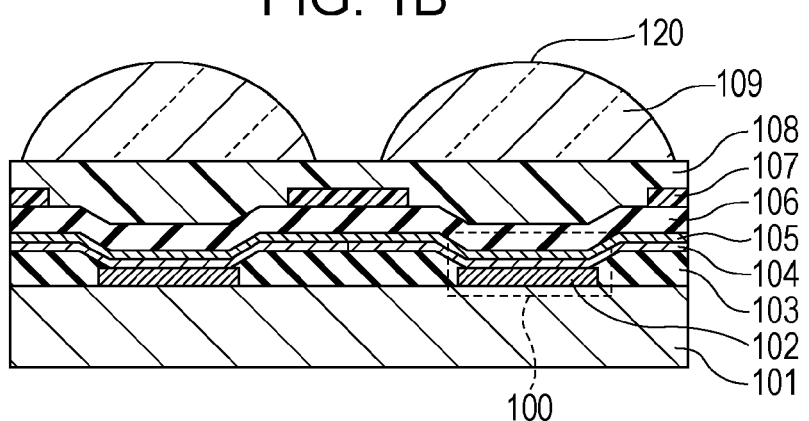

FIG. 1B is a partial sectional schematic view taken along line IB-IB of FIG. 1A. Reference numeral 100 denotes an organic electroluminescent element, which includes a first electrode 102, an organic compound layer 104, and a second electrode 105. Reference numeral 101 denotes a substrate, reference numeral 103 denotes an insulating layer, reference numeral 106 denotes a protective layer, reference numeral 107 denotes a light absorbing layer, reference numeral 108 denotes a foundation layer, and reference numeral 109 denotes a lens portion. The organic electroluminescent elements 100 are driven by transistors (not shown) provided on the substrate 101.

The light absorbing layer 107 is disposed outside the light-emitting regions of the plurality of organic electroluminescent elements 100, for the purpose of reducing reflection of external light, and for the purpose of suppressing color mixture between adjacent pixels. The light absorbing layer 107 is disposed closer to the organic electroluminescent elements 100 than the lens portion 109. The light-emitting region is a region where in a direction perpendicular to the substrate, the organic compound layer 104 is in contact with and sandwiched between the first electrode 102 and the second electrode 105.

The foundation layer 108 is disposed, as described later, for the purpose of preventing the lens portion 109 and the light absorbing layer 107 from being in contact with each other. Specifically, the foundation layer 108 is disposed so as to be located between the light absorbing layer 107 and the lens portion 109 and to be in contact with the light absorbing layer 107 and the lens portion 109. The foundation layer 108 covers the region where the lens portion 109 is formed. More specifically, the foundation layer 108 is disposed so as to cover the light-emitting regions of the organic electroluminescent elements 100 and the light absorbing layer 107.

Figure 1C:
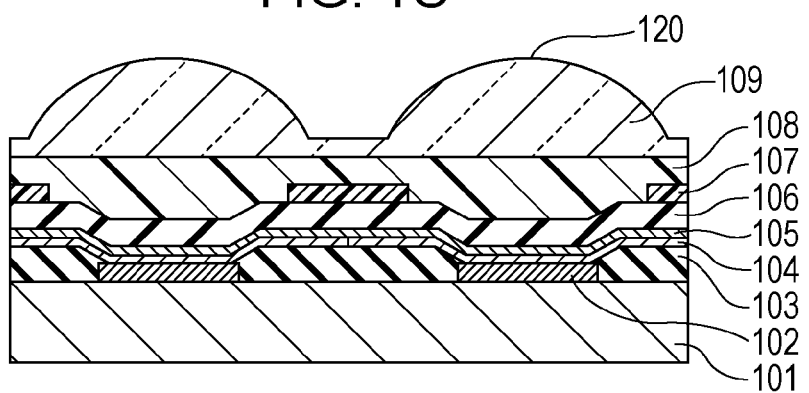

The lens portion 109 has lenses 120 that are disposed over the light-emitting regions of the plurality of organic electroluminescent elements 100 and have a function to improve the light extraction efficiency of the organic electroluminescent elements 100. The lenses 120 of the lens portion 109 are disposed at positions corresponding to the light-emitting regions of the organic electroluminescent elements 100. In the case where the lens portion 109 is divided into separate sections corresponding to the pixels, the foundation layer 108 may also be divided into separate sections corresponding to the pixels. As shown in FIG. 1C, the lens portion 109 may be a continuous layer.

Method for Manufacturing Display Apparatus

Next, a method for manufacturing the display apparatus of this embodiment will be described with reference to FIGS. 2A to 2F and FIGS. 3A to 3C. FIGS. 2A to 2F and FIGS. 3A to 3C are sectional schematic views showing the manufacturing process of the display apparatus of this embodiment. The process up until the formation of the second electrode 105 is well-known manufacturing process, and so the description thereof will be omitted.

Figure 2A:
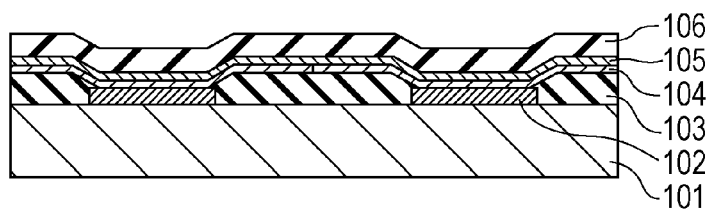
FIGS. 2A to 2F illustrate a method for manufacturing a display apparatus according to the first embodiment.

First, as shown in FIG. 2A, a substrate 101 on which a plurality of organic electroluminescent elements 100 are formed is prepared. The substrate 101 has pixel circuits (not shown) such as transistors, a semiconductor protecting layer, a planarization film, first electrodes 102, an insulating layer 103, an organic compound layer 104, and a second electrode 105.

The first electrodes 102 are formed of a highly reflective conductive metal material, for example, Ag. The first electrodes 102 may be laminated bodies of a layer formed of the above-described metal material and a layer formed of a transparent conductive material such as ITO (Indium-Tin-Oxide) having an excellent hole injection property.

The second electrode 105 is common to the plurality of organic electroluminescent elements 100 and has a semi-reflecting or light-transmitting configuration so that light emitted from the organic compound layer 104 can be extracted from the elements. Specifically, in the case where the second electrode 105 has a semi-reflecting configuration in order to improve the interference effect in the elements, the second electrode 105 is formed of a conductive metal material having an excellent electron injection property such as Ag or AgMg and has a film thickness of 2 to 50 nm. The term "semi-reflecting" means a property of partially reflecting and partially transmitting light emitted in the elements, and having a reflectance of 20 to 80% for visible light. The term "light-transmitting" means having a transmittance of 80% or more for visible light. As long as one of the first electrode 102 and the second electrode 105 is the anode and the other is the cathode, it is appropriately determined which is the anode or cathode.

The organic compound layer 104 includes one or more layers that include at least a light-emitting layer. Examples of the configuration of the organic compound layer 104 include a four-layer configuration consisting of a first transport layer, a light-emitting layer, a second transport layer, and an injection layer, and a three-layer configuration consisting of a first transport layer, a light-emitting layer, and a second transport layer. The organic compound layer 104 can be formed of publicly known materials. Of the hole transport property and the electron transport property, and of the hole injection property and the electron injection property, any polarity can be selected.

The insulating layer 103 is provided between the pixels (more specifically, between the first electrodes 102) in order to prevent the first electrodes 102 and the second electrode 105 from shorting out owing to a foreign substance. The protective layer 106 covers the plurality of organic electroluminescent elements 100 so as to prevent the entrance of moisture or oxygen into the organic electroluminescent elements 100 from outside.

Next, as shown in FIG. 2A, the protective layer 106 is formed throughout the display region 2. The protective layer 106 is a member for preventing moisture or oxygen from coming into contact with the organic electroluminescent elements 100, in other words, a member having a sealing function. Thus, the protective layer 106 can be highly resistant to damp. The thickness of the protective layer 106 is not particularly limited. Practically, the thickness of the protective layer 106 is preferably about 1.0 μm to about 50 μm. The protective layer 106 is formed of an inorganic material such as SiN or SiON. The protective layer 106 can be a lamination of two layers, for example, of two different inorganic materials, or of an inorganic material and an organic resin material such as epoxy resin. Although in FIG. 2A, the surface of the protective layer 106 conforms to the second electrode 105, it may be flat.

Figure 2B:
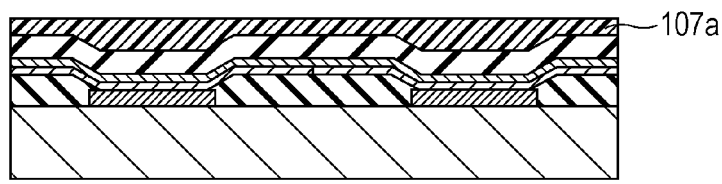

Next, as shown in FIG. 2B, on the protective layer 106, a light absorbing layer material 107a is formed throughout the display region 2. Black resist can be used as the light absorbing layer material 107a. In the case where black resist is used, a spin coat method, a dispense method, or the like can be used as a film formation method.

Figure 2C:
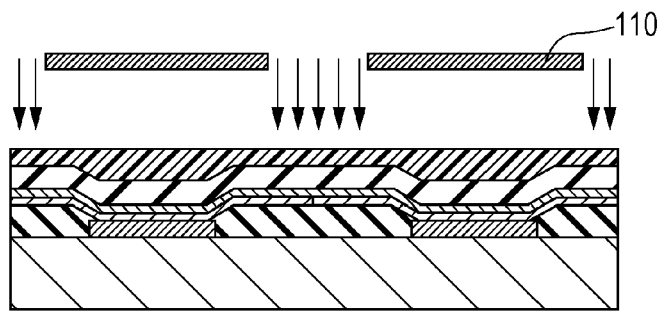
Figure 2D:
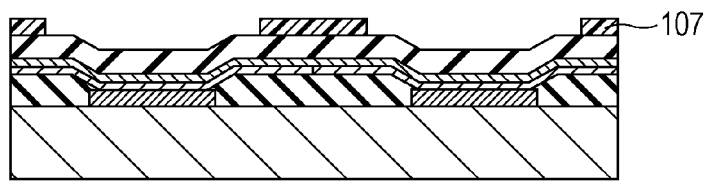

Next, as shown in FIG. 2C, using a photomask 110, the black resist in the parts where it is desired to form the light absorbing layer 107 is exposed. After that, by performing development, the pattern shown in FIG. 2D is obtained. The light absorbing layer 107 is formed of a resin material having a low light transmittance. The film thickness of the light absorbing layer 107 is preferably about 10 nm to about 10 μm so that the light absorbing layer 107 can sufficiently block light. The pattern of the light absorbing layer 107 is formed so as to be able to absorb much of external light and to absorb much of light to the lens 120 corresponding to the adjacent pixel. The openings of the light absorbing layer 107 can be wider than the interval between pixels and narrower than the interval between the lenses 120. The light absorptance of the light absorbing layer 107 is preferably 90% or more for visible light.

Figure 2E:
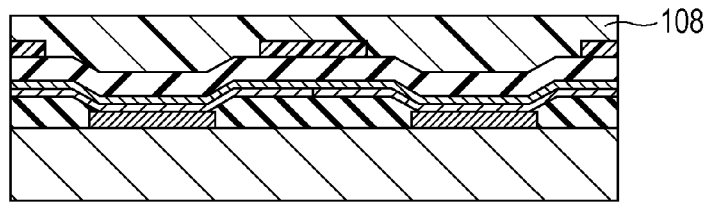

Next, as shown in FIG. 2E, the foundation layer 108 is formed throughout the display region 2. The foundation layer 108 is for solving the following problem when the lens portion 109 is directly formed on the light absorbing layer 107.

Firstly, in the case where the lens portion 109 is formed on surfaces formed of different materials such as the light absorbing layer 107 and the protective layer 106, since the adhesion to the lenses and the thermal stress differ depending on the material, stress concentration tends to occur at a mechanical part, and detachment or cracking occurs in the lens portion 109. In addition, when as shown in FIG. 1B, the thickness of the lenses 120 is not uniform in the in-plane direction of the substrate 101, the structural strength of the thin part is weak, the amount of deformation due to thermal expansion or the like is not uniform, and detachment is more likely to occur. The thin parts of the lens portion 109 tend to be starting points of detachment or cracking.

Secondly, when the lens portion 109 is provided on surfaces formed of different materials, sometimes the wettability differs from surface to surface owing to the difference in surface energy. When developing the material for the lens portion 109 in order to form lenses 120 in the lens portion 109, or during the heating after development, the shape of the lenses 120 becomes difficult to control, and sometimes unevenness or discoloration occurs.

Thirdly, surfaces formed of different materials differ in ultraviolet reflection absorption property at the time of exposure. In the case where a photosensitive material is used as the lens portion 109, the exposing conditions need to be changed according to location. If the exposing conditions are not changed according to location, the shape of the lenses 120 is unstable.

For this reason, in the present invention, after the light absorbing layer 107 is formed and before the lens portion 109 described later is formed, the foundation layer 108 is formed. At that time, the foundation layer 108 is formed so as to cover a region where the lens portion 109 is formed and to be in contact with the light absorbing layer 107 and the lens portion 109. Owing to this configuration, the lens portion 109 is not in contact with the light absorbing layer 107, and the lens portion 109 can be formed on the same material, and thus detachment and cracking of the lens portion 109 can be suppressed. In addition, the shape of the lenses 120 can be easily controlled. The foundation layer 108 may have a function to planarize the uneven light absorbing layer 107 or a function to control the distance between the lens portion 109 and the organic compound layer 104.

The film thickness of the foundation layer 108 is preferably 10 nm to 100 μm. The foundation layer 108 can be formed of negative resist (OMR-83 manufactured by TOKYO OHKA KOGYO CO., LTD. or SU-8 manufactured by NIPPON KAYAKU CO., LTD.), light curing resin (KZ6666 manufactured by JSR CORPORATION), thermoset resin that absorbs ultraviolet light (HALSHYBRID UV-G manufactured by NIPPON SHOKUBAI CO., LTD.), or the like. The foundation layer 108 preferably has a light transmittance of 80% or more in visible light range. The difference in refractive index between the foundation layer 108 and the lens portion 109 can be small from the viewpoint of improvement of light extraction efficiency. Specifically, the difference in refractive index between the foundation layer 108 and the lens portion 109 is preferably 0.2 or less. In the case where the lenses 120 of the lens portion 109 are convex lenses, the refractive index of the foundation layer 108 can be higher than the refractive index of the lens portion 109 from the viewpoint of improvement of light collecting property.

Figure 2F:
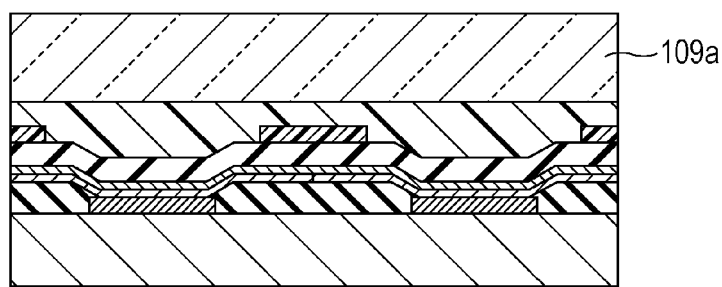

Next, as shown in FIG. 2F, a lens portion material 109a is formed throughout the display region 2. The thickness thereof is preferably 1.0 μm to 50 μm. Positive type resist (AZ4620 manufactured by AZ ELECTRONIC MATERIALS) can be used as a lens portion material suitable for this embodiment.

Figure 3A:
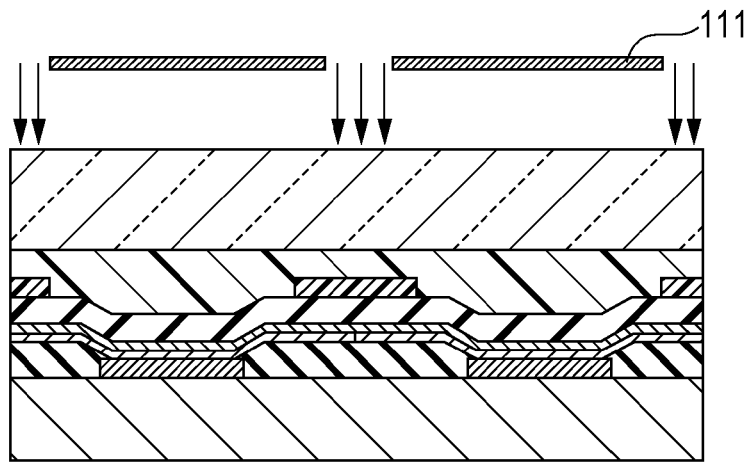
FIGS. 3A to 3C illustrate the method for manufacturing a display apparatus according to the first embodiment.
Figure 3B:
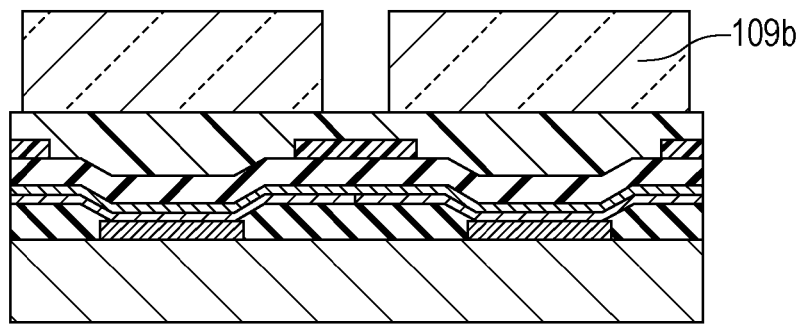
Figure 3C:
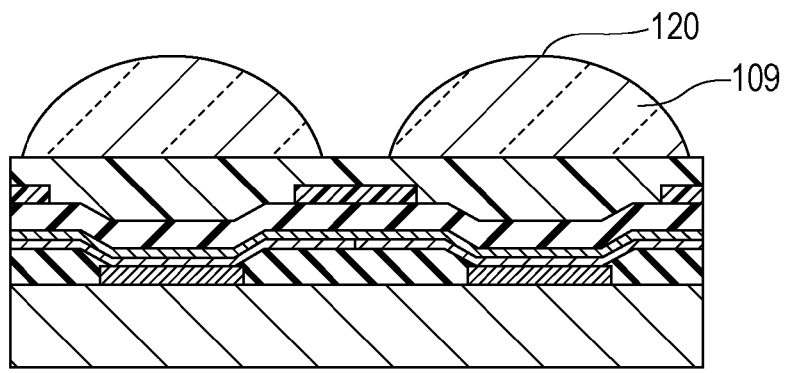

Next, as shown in FIG. 3A, using a photomask 111, the lens portion material 109a other than the parts where lenses 120 are formed is exposed. After that, by performing development, the pattern shown in FIG. 3B is obtained. By heating this at a predetermined temperature, the lens portion pattern 109b is melted, and by surface tension, the lens portion 109 having spherical lenses 120 shown in FIG. 3C is formed. The lenses 120 have a height (the distance between the foundation layer 108 and the top of each lens 120) and a curvature radius that are selected according to necessary optical functions such as a light collecting property. In the case of convex lenses 120, if the curvature radius is selected such that the focal positions of the lenses 120 are close to the light-emitting layer, the property of collecting light emitted from the organic electroluminescent elements 100 is improved, and the luminance in a desired direction can be increased, but the light quantity in directions other than the desired direction decreases. For this reason, it is necessary to select according to application. Lenses 120 do not necessarily have to be disposed at positions corresponding to the light-emitting regions. Pixels where lenses 120 are formed and pixels where lenses 120 are not formed may be determined according to the emission colors of pixels. A plurality of lenses 120 may be formed in a light-emitting region. The shape of the lenses 120 is not particularly limited, may be convex or concave, and may be spherical or aspherical.

Second Embodiment

A method for manufacturing a display apparatus of a second embodiment will be described with reference to FIGS. 4A and 4B. This embodiment is the same as the first embodiment up until the step of forming the lens portion material 109a throughout the display region 2, shown in FIG. 2F.

Figure 4A:
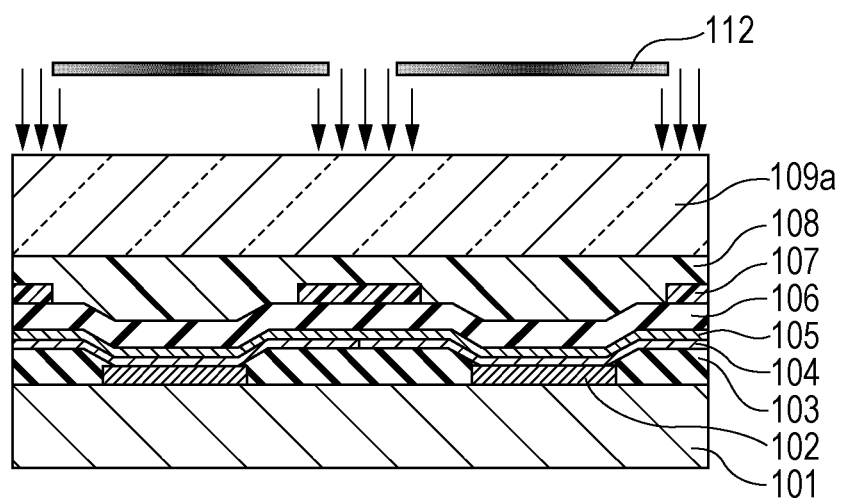
FIGS. 4A and 4B illustrate a method for manufacturing a display apparatus according to the second embodiment.
Figure 4B:
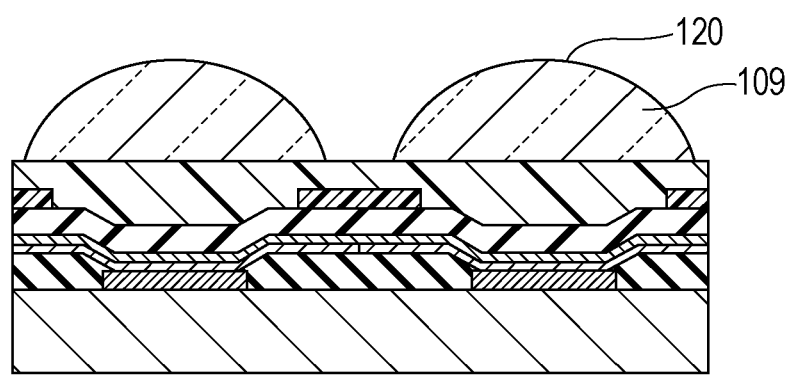

In this embodiment, in place of the photomask 111 of FIG. 3A in the first embodiment, using a gray scale mask 112 shown in FIG. 4A, the lens portion material 109a is exposed. By developing this, the lens portion 109 having desired lenses 120 of FIG. 4B is formed. At this time, the uniformity and reproducibility of exposing conditions are more important than in the first embodiment, and the light absorption/reflection property of the layer under the lens portion material 109a can be uniform. Thus, the effect obtained by providing the foundation layer 108 is larger than in the first embodiment. The foundation layer 108 can be formed of thermoset resin that absorbs ultraviolet light. By providing a foundation layer 108 of thermoset resin that absorbs ultraviolet light, the shape of the lenses 120 of the lens portion 109 can be stably formed. Positive type resist can be a lens portion material suitable for this embodiment.

Third Embodiment

A method for manufacturing a display apparatus of a third embodiment will be described with reference to FIGS. 5A to 5C and FIGS. 6A and 6B. This embodiment is the same as the first embodiment up until the step of forming the lens portion material 109a throughout the display region 2, shown in FIG. 2F. However, in this case, negative-type resist (SU-8 manufactured by NIPPON KAYAKU CO., LTD.) is used as a lens portion material 109a.

Figure 5A:
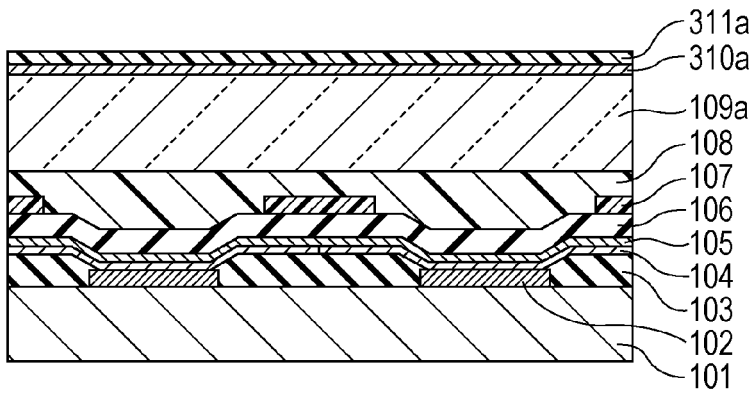
FIGS. 5A to 5C illustrate a method for manufacturing a display apparatus according to a third embodiment.
Figure 5B:
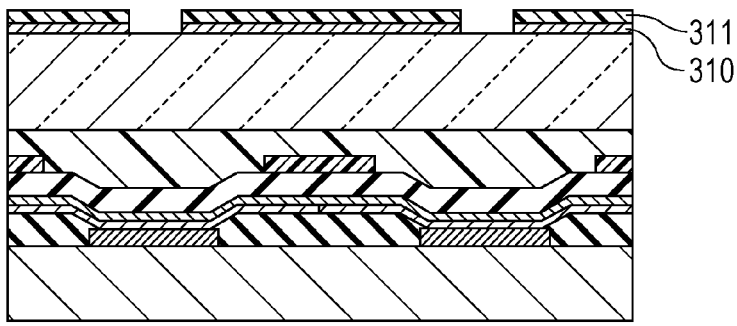

Next, as shown in FIG. 5A, on the lens portion material 109a, for example, a light-blocking metal film 310a (aluminum, nickel, chrome, or the like) is formed, and then photoresist 311a is formed.

Next, the photoresist 311a is exposed using a photomask (not shown) and developed. Thus, a resist pattern 311 is formed. The metal film 310a is etched using the resist pattern 311 as a mask to form a metal film pattern 310 shown in FIG. 5B.

Figure 5C:
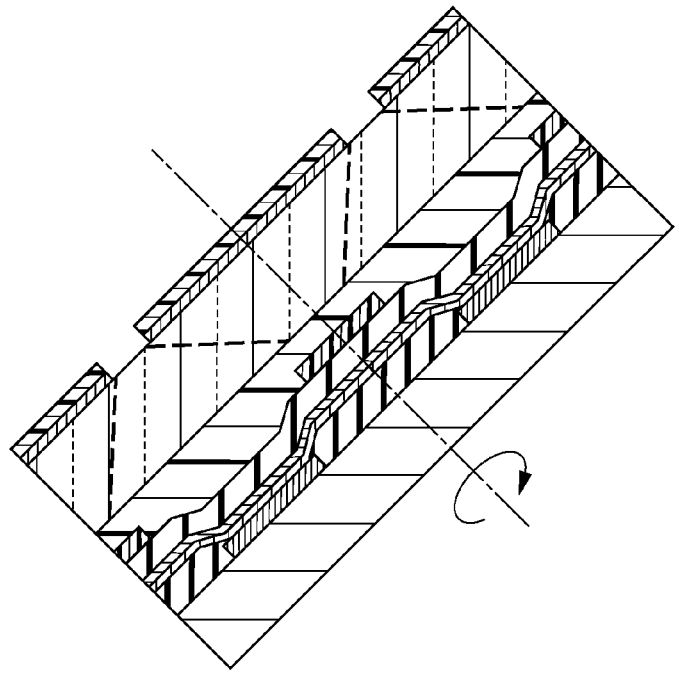

Next, using the metal film pattern 310 shown in FIG. 5C as a mask, parts of the lens portion material 109a surrounded by dashed lines are exposed while rotating the substrate 101 inclined at an angle. The inclination angle is changed as needed to change the volume of the exposed parts. In the case where a desired angle cannot be obtained, exposure may be performed in a fluid, for example, water in order to control the refractive index.

Figure 6A:
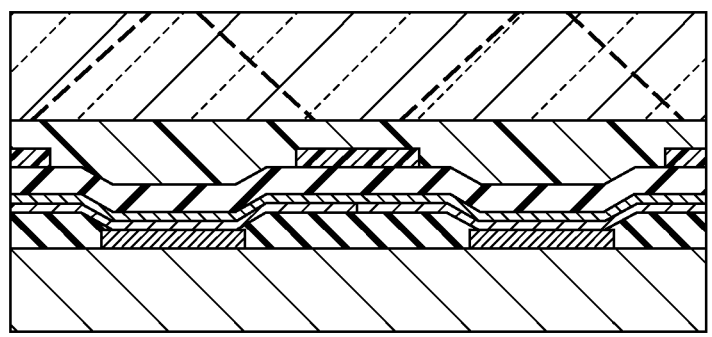
FIGS. 6A and 6B illustrate the method for manufacturing a display apparatus according to the third embodiment.

Next, as shown in FIG. 6A, the resist pattern 311 and the metal film pattern 310 are removed.

Figure 6B:
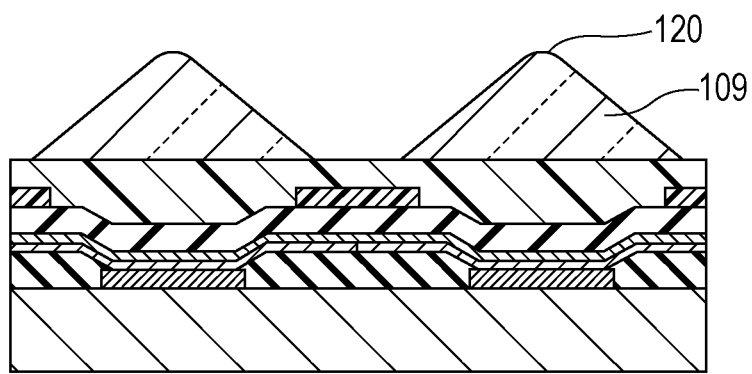

Next, as shown in FIG. 6B, the lens portion material 109a is developed, and a lens portion 109 having conic lenses 120 is formed. In the case of negative resist, it is necessary to accelerate the reaction by the heating after exposure. This is accompanied by a change in shape. By providing the foundation layer 108, a stable shape can be formed regardless of location.

Forth Embodiment

A method for manufacturing a display apparatus of a fourth embodiment will be described with reference to FIGS. 7A and 7B and FIGS. 8A and 8B. This embodiment is the same as the first embodiment up until the step of forming the lens portion material 109a throughout the display region 2, shown in FIG. 2F.

Figure 7A:
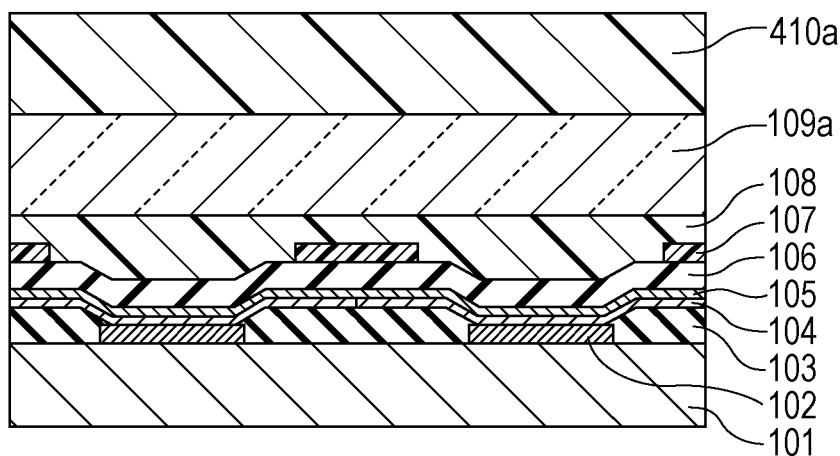
FIGS. 7A and 7B illustrate a method for manufacturing a display apparatus according to a fourth embodiment.

Next, as shown in FIG. 7A, photoresist 410a for making lens shape is formed on the lens portion material 109a.

Figure 7B:
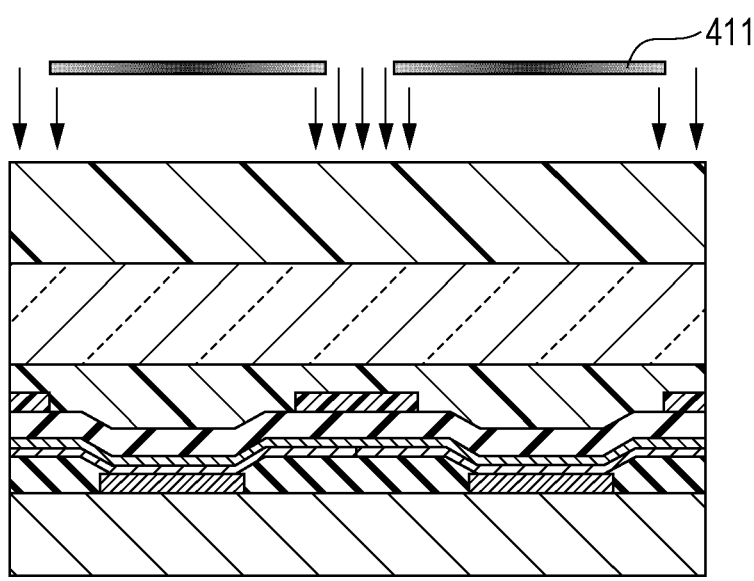
Figure 8A:
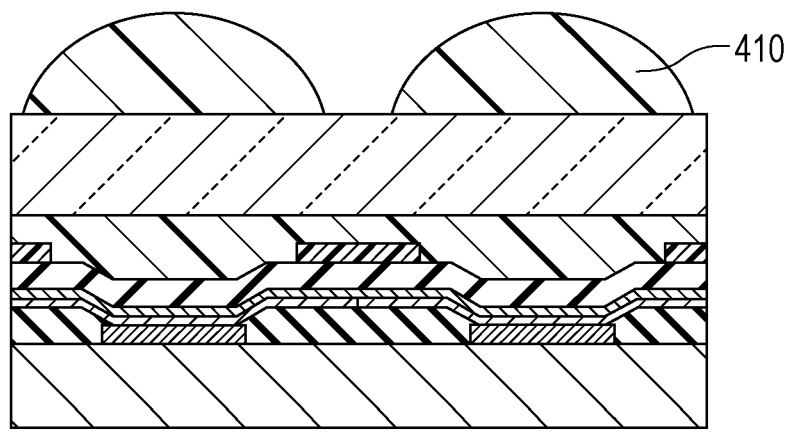
FIGS. 8A and 8B illustrate the method for manufacturing a display apparatus according to the fourth embodiment.

Next, as shown in FIG. 7B, exposure is performed using the gray scale mask 411, and then development is performed to form a resist pattern 410 having the shape shown in FIG. 8A.

Figure 8B:
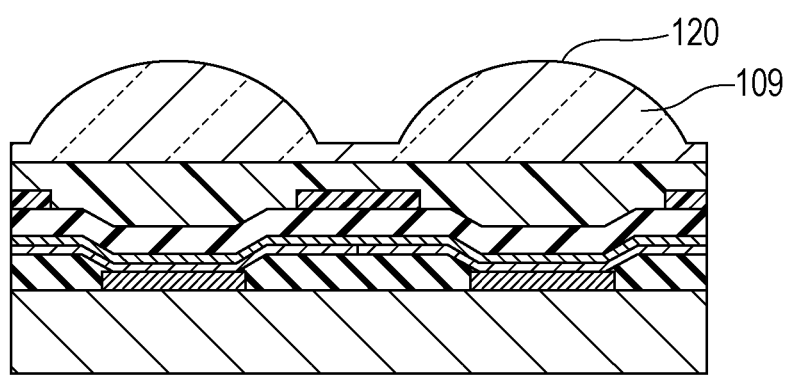

Next, by dry etching the resist pattern 410 and the lens portion material 109a, a lens portion 109 having the same shape as the resist pattern 410 as shown in FIG. 8B is formed. By changing the conditions of dry etching, the correspondence between the shape of the resist and the shape of the lens portion can be controlled.

At this time, the uniformity and reproducibility of exposing conditions are more important than in the first embodiment, and the light absorption/reflection property of the layer under the lens portion material 109a can be uniform. Thus, the effect obtained by providing the foundation layer 108 is larger than in the first embodiment. The foundation layer 108 can be formed of thermoset resin that absorbs ultraviolet light. By providing a foundation layer 108 of thermoset resin that absorbs ultraviolet light, the shape of the lenses 120 of the lens portion 109 can be stably formed.

In this embodiment, the lens portion 109 can also be formed of a material not for pattern formation in a photolithographic technique (for example, KZ6666 manufactured by JSR CORPORATION).

EXAMPLES

Example 1

On a glass substrate, pixel circuits (not shown) were formed of low-temperature polysilicon TFTs. Thereon, a semiconductor protective layer of SiN and a planarization layer of polyimide resin were formed in this order. Thus, the substrate 101 shown in FIG. 2A was formed. On the substrate 101, an AlNd film 100 nm in thickness and an ITO film 38 nm in thickness were formed in this order by sputtering. Next, the AlNd film and the ITO film were patterned on a pixel to pixel basis to form first electrodes 102.

Next, the first electrodes 102 were coated with polyimide resin by spin coating. The polyimide resin was patterned by a photolithographic technique such that openings (these openings correspond to pixels) were formed in parts where the first electrodes 102 were formed, to form an insulating layer 103. The pitch between pixels was 30 μm, and the size of the parts of the first electrodes 102 exposed by the openings was 10 μm. This was ultrasonic cleaned in isopropyl alcohol (IPA) and was then cleaned by boiling and dried.

Next, after UV/ozone cleaning, an organic compound layer 104 was formed by a vacuum evaporation technique. First, a hole transport layer 90 nm in thickness was formed throughout all pixels. Next, using a shadow mask, a red light-emitting layer 30 nm in thickness, a green light-emitting layer 40 nm in thickness, and a blue light-emitting layer 25 nm in thickness were formed. In the figures, two pixels of two colors are shown, and other pixels are omitted because the same configuration is repeated. Next, an electron transport layer 50 nm in thickness that was common to all pixels was formed.

Next, the substrate 101 on which the organic compound layer 104 was formed was moved to a sputtering apparatus without breaking the vacuum, and an Ag film 10 nm in thickness and an ITO film 50 nm in thickness were formed in order as a second electrode 105.

Next, as shown in FIG. 2A, a protective layer 106 of silicone nitride having a thickness of 6.0 μm was formed by a plasma CVD method using $SiH_4$ gas, $N_2$ gas, and $H_2$ gas.

Next, as shown in FIG. 2B, black resist manufactured by TOKYO OHKA KOGYO CO., LTD. was applied as a light absorbing layer material 107a using a spin coater. The film thickness was 1.0 μm.

Next, as shown in FIG. 2C, the black resist was exposed using a photomask 110 in which dots 20 μm in diameter were arranged at a pixel pitch of 30 μm, and was then developed to form a light absorbing layer 107 shown in FIG. 2D and having openings corresponding to pixels.

Next, as shown in FIG. 2E, an ultraviolet curable resin (negative resist) SU-8, 3005 manufactured by NIPPON KAYAKU CO., LTD. was applied as a foundation layer 108 using a spin coater. After that, the ultraviolet curable resin was exposed, and thermally cured. The film thickness was 5.0 μm.

Next, as shown in FIG. 2F, positive-type resist AZ4620 manufactured by AZ ELECTRONIC MATERIALS was applied as a lens portion material 109a using a spin coater. The film thickness was 10 μm.

Next, as shown in FIG. 3A, exposure was performed using a photomask 111 having a dot pattern in which dots 25 μm in diameter were arranged at a pitch of 30 μm. By developing the lens portion material 109a, a lens portion pattern 109b shown in FIG. 3B was formed.

Finally, by heating and melting the lens portion pattern 109b, a lens portion 109 having lenses 120 shown in FIG. 3C was formed. The height of the lens portion 109 was 14 μm, and the curvature radius of the lenses 120 was 20 μm.

The lens portion 109 formed in this manner was free from detachment and cracking.

Comparative Example 1

This comparative example was the same as example 1 except that the step of forming the foundation layer 108 was omitted. The lens portion 109 formed in this manner was partly detached. The cause is that the lens portion 109 was provided on the light-absorbing layer 107 and in the openings where the light-absorbing layer 107 does not exist, the light-absorbing layer 107 was different in adhesion, thermal stress, wettability, and the like from the bottoms of the openings (the protective layer 106), and stress was not able to be absorbed.

Example 2

This example is the same as example 1 up until the step of forming the light absorbing layer 107. On the light absorbing layer 107, as shown in FIG. 2E, a thermoset resin that absorbs ultraviolet light, HALSHYBRID UV-G manufactured by NIPPON SHOKUBAI CO., LTD. was applied as a foundation layer 108 using a spin coater. After that, the ultraviolet curable resin was exposed, and thermally cured. The film thickness was 5.0 μm.

Thereon, as in example 1, positive-type resist AZ4620 manufactured by AZ ELECTRONIC MATERIALS was applied as a lens portion material 109a using a spin coater. The film thickness was 10 μm.

Next, as shown in FIG. 4A, the lens portion material 109a was exposed using a gray scale mask 112 manufactured by TOPPAN PRINTING CO., LTD. and an exposure apparatus MPA-600F manufactured by CANON KABUSHIKI KAISHA. By developing this with developer AZ400K manufactured by AZ ELECTRONIC MATERIALS, a lens portion 109 having lenses 120 shown in FIG. 4B was formed. The height of the lens portion 109 was 8.0 μm, and the curvature radius of the lenses 120 was 20 μm.

The lens portion 109 formed in this manner was free from detachment and cracking. The shape of the lens portion 109 was able to be stably formed.

Example 3

This example is the same as example 1 up until the step of forming the light absorbing layer 107. Next, as shown in FIG. 2E, an ultraviolet curable resin KZ6666 manufactured by JSR CORPORATION was applied as a foundation layer 108 using a spin coater. After that, this ultraviolet curable resin was exposed, and thermally cured. The film thickness was 3.0 μm.

Next, as shown in FIG. 2F, negative-type resist SU-8 manufactured by NIPPON KAYAKU CO., LTD. was applied as a lens portion material 109a using a spin coater. The film thickness was 10 μm.

Next, as shown in FIG. 5A, an aluminum film 100 nm in thickness was formed as a light-blocking metal film 310a by sputtering, and positive type photoresist 311a (AZ1500 manufactured by AZ ELECTRONIC MATERIALS) was formed.

Next, the photoresist 311a was exposed using a photomask (not shown), and was then developed to form a resist pattern 311. Using the resist pattern 311 as a mask, the metal film 310a was etched to form a metal film pattern 310 of FIG. 5B.

Next, as shown in FIG. 5C, using the metal film pattern 310 as a mask, the lens portion material 109a was exposed while rotating the substrate 101 inclined at an angle of 45 degrees.

Next, as shown in FIG. 6A, the resist pattern 311 and the metal film pattern 310 were removed.

Next, the lens portion material 109a was developed to form a lens portion 109 having lenses 120 shown in FIG. 6B. The height of the lens portion 109 was 6.0 μm, the diameter of the bottoms of the conic lenses 120 was 20 μm, and the diameter of the upper surfaces of the conic lenses 120 was 8.0 μm.

The lens portion 109 formed in this manner was free from detachment and cracking. The shape of the lens portion 109 was able to be stably formed.

Comparative Example 2

This comparative example was the same as example 3 except that the step of forming the foundation layer 108 was omitted. The lens portion 109 formed in this manner was partly detached. The cause is that the lens portion 109 was provided on the light-absorbing layer 107 and in the openings where the light-absorbing layer 107 does not exist, the light-absorbing layer 107 was different in adhesion, thermal stress, wettability, and the like from the bottoms of the openings (the protective layer 106), and stress was not able to be absorbed.

Example 4

This example is the same as example 2 up until the step of forming the foundation layer 108. Next, as shown in FIG. 2F, KZ6666 manufactured by JSR CORPORATION was applied as a lens portion material 109a using a spin coater. The film thickness was 15 μm.

Next, as shown in FIG. 7A, on the lens portion material 109a, AZ4620 manufactured by AZ ELECTRONIC MATERIALS was applied as photoresist 410a for making lens shape, using a spin coater.

Next, as shown in FIG. 7B, the photoresist 410a was exposed using a gray scale mask 411 manufactured by TOPPAN PRINTING CO., LTD. and was then developed to form a resist pattern 410 shown in FIG. 8A.

Next, by dry etching the resist pattern 410 and the lens portion material 109a, a lens portion 109 having a shape defined by the shape of the resist pattern 410 was formed as shown in FIG. 8B. The height of the lens portion 109 was 8.0 μm, and the curvature radius of the lenses 120 was 20 μm. Dry etching was performed using a reactive ion etching apparatus manufactured by ULVAC, INC., using $CF_4$ gas and $O_2$ gas, under the following conditions: pressure, 10 Pa; and electric power, 150 W.

The lens portion 109 formed in this manner was free from detachment and cracking. The shape of the lens portion 109 was able to be stably formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-092156 filed Apr. 18, 2011, which is hereby incorporated by reference herein in its entirety.

What is claimed is:

1. A method for manufacturing a display apparatus, the method comprising:
    forming a plurality of organic electroluminescent elements on a substrate;
    forming a light absorbing layer outside the light-emitting regions of the plurality of organic electroluminescent elements; and
    forming a lens portion over the light-emitting regions of the plurality of organic electroluminescent elements and the lens portion is formed above the light absorbing layer,
    wherein the method further comprises, between forming a light absorbing layer and forming a lens portion, forming a foundation layer such that the foundation layer covers a region where the lens portion is to be formed, and wherein the foundation layer is in contact with the light absorbing layer and the lens portion once the lens portion is formed.

2. A display apparatus comprising:
    a substrate;
    a plurality of organic electroluminescent elements on the substrate;

a light absorbing layer outside the light-emitting regions of the plurality of organic electroluminescent elements; and a lens portion over the light-emitting regions of the plurality of organic electroluminescent elements, wherein the light absorbing layer is disposed between the organic electroluminescent elements and the lens portion, and the display apparatus further comprises, between the light absorbing layer and the lens portion, a foundation layer that covers a region upon which the lens portion is formed, and wherein the foundation layer is in contact with the light absorbing layer and the lens portion.

3. A display apparatus according to claim 2, wherein a film thickness of the foundation layer is preferably 10 nm to 100 μm.

4. A display apparatus according to claim 2, wherein the foundation layer has a light transmittance of 80% or more in visible light range.

5. A display apparatus according to claim 2, wherein a difference in refractive index between the foundation layer and the lens portion is 0.2 or less.

6. A display apparatus according to claim 2, wherein a refractive index of the foundation layer is higher than that of the lens portion.

7. An apparatus comprising
a substrate;
a plurality of organic electroluminescent elements on the substrate;
a light absorbing layer outside the light-emitting regions of the plurality of organic electroluminescent elements; and
a lens portion over the light-emitting regions of the plurality of organic electroluminescent elements,
wherein the light absorbing layer is disposed between the organic electroluminescent elements and the lens portion, and the display apparatus further comprises, between the light absorbing layer and the lens portion, a foundation layer that covers a region upon which the lens portion is formed, and wherein the foundation layer is in contact with the light absorbing layer and the lens portion.

* * * * *